(12) United States Patent
Kudelka et al.

(10) Patent No.: US 6,426,254 B2
(45) Date of Patent: *Jul. 30, 2002

(54) METHOD FOR EXPANDING TRENCHES BY AN ANISOTROPIC WET ETCH

(75) Inventors: Stephen Kudelka, Fishkill; Alexander Michaelis, Wappingers Falls, both of NY (US); Dirk Tobben, Langebrueek (DE)

(73) Assignee: Infineon Technologies AG, Munich (DE)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/328,763

(22) Filed: Jun. 9, 1999

(51) Int. Cl.[7] .......................................... H01L 21/8242
(52) U.S. Cl. ........................ 438/246; 438/243; 438/249
(58) Field of Search ................................. 438/243, 244, 438/245, 246, 247, 248, 249, 386, 387, 388, 389, 390, 391, 392; 257/301, 302, 303, 304, 305

(56) References Cited

U.S. PATENT DOCUMENTS

| | | | |
|---|---|---|---|
| 4,171,242 A | * 10/1979 | Liu | 156/657 |
| 4,397,075 A | 8/1983 | Fatula | 29/571 |
| 4,702,795 A | * 10/1987 | Douglas | 156/643 |
| 4,763,179 A | 8/1988 | Tsubouchi | 357/23.6 |
| 4,971,926 A | 11/1990 | Kinugawa | 437/67 |
| 5,207,866 A | 5/1993 | Lue | 156/647 |
| 5,583,368 A | * 12/1996 | Kenney | 257/621 |
| 5,629,226 A | 5/1997 | Ohtsuki | 438/389 |
| 6,008,104 A | * 12/1999 | Schrems | 438/386 |
| 6,018,174 A | * 1/2000 | Schrems et al. | 257/296 |
| 6,033,944 A | * 3/2000 | Shida | 438/199 |
| 6,066,571 A | * 5/2000 | Usuda et al. | 436/745 |

FOREIGN PATENT DOCUMENTS

| | | | |
|---|---|---|---|
| DE | 4037202 | 5/1992 | |
| DE | 42 17 420 A1 | 12/1992 | H01L/27/108 |

* cited by examiner

*Primary Examiner*—Trung Dang
*Assistant Examiner*—William M. Brewster
(74) *Attorney, Agent, or Firm*—Stanton Braden (57) ABSTRACT

In accordance with the present invention, a method for expanding trenches includes the steps of forming a trench in a substrate, preparing surfaces withIn the trench by etching the surfaces with a wet etchant to provide a hydrogen terminated silicon surface and anisoropically wet etching the trench to expand the trench.

17 Claims, 10 Drawing Sheets

METHOD FOR EXPANDING TRENCHES BY AN ANISOTROPIC WET ETCH

BACKGROUND

1. Technical Field

This disclosure relates to semiconductor fabrication and more particularly, to a method for forming bottle shaped trench capacitors for semiconductor memories by employing an anisotropic wet etch process.

2. Description of the Related Art

The extendability of deep trench based memory devices is limited by the storage capacitance of the deep trench as the ground rules shrink. Since the capacitance that can be stored in the deep trench is a linear function of the surface area of the deep trench, the formation of a larger trench is beneficial. However, widening a deep trench has a large impact on layout area of a semiconductor chip.

Attempts have been made to increase the surface area of a deep trench below an insulating collar which is formed within the deep trench. The region below the insulating collar is not as limited in available area as an upper portion of the deep trench. To expand the region below the collar, an isotropic silicon reactive ion etch (RIE) process can be employed. The RIE process recesses a silicon substrate below the insulating collar to provide increased surface area. The RIE process suffers from many disadvantages. These disadvantages include:

1. Low selectivity to oxide. With the reactive ion etch process the insulating collar is also etched thereby reducing the thickness of the insulating collar. The insulating collar is, for example, a LOCOS oxide or a deposited oxide. When this oxide is thinned vertical leakage currents may occur.

2. Expensive process. The RIE tools are expensive and have a low throughput due to the need for single wafer processing.

3. Collateral damage. The RIE process leaves polymer deposits in etched areas which may have a detrimental effect on component performance. The RIE process may cause surface damage to etched areas and undesirable side pockets may be formed in etched areas.

Therefore, a need exists for an improved method for increasing surface area of deep trench capacitors. A further need exists for a more economical method of increasing the surface area of the deep trench capacitors.

SUMMARY OF THE INVENTION

In accordance with the present invention, a method for expanding trenches includes the steps of forming a trench in a substrate, preparing surfaces within the trench by etching the surfaces with a wet etchant to substantially remove native oxide (create an H-terminated surface) from the surfaces within the trench and anisotropically wet etching the surfaces of the trench to expand the trench.

A method for forming expanded deep trenches for semiconductor devices includes the steps of forming a trench in a substrate, forming a collar in an upper portion of the trench, anisotropically etching a lower portion of the trench selective to the collar by: preparing a surface of the lower portion of the trench by providing a hydrogen Terminated surface on the lower portion of the trench and wet etching the lower portion of the trench with a basic solution to expand the trench.

Another method for forming expanded deep trenches for semiconductor devices includes the steps of forming a trench in a monocrystallIne silicon substrate, forming an oxide collar in an upper portion of the Ereich, preparing a surface of a lower portion of the trench by etching the surface with hydrogen fluoride, the surface being prepared to provide a hydrogen terminated surface on The lower portion of the trench and anisotropically wet etching, with an ammonium hydroxide etchant, the lower portion of :he trench being etched selective to the collar to expand the trench to crystallographic surfaces of the substrate in the lower portion of the trench.

In alternate embodiments, the step of preparing surfaces within the trench may include the step of preparing the surface by etching the surfaces with hydrogen fluoride. The step of anisotropically wet etching the trench to expand the trench may include the step of anisotropically wet etching the trench by employing ammonium hydroxide. The step of anisotropically wet etching the trench to expand the trench may also include the step of anisotropically wet etching the trench at temperatures of between about 10° C. to about 80° C. The step of anisotropically wet etching the trench to expand the trench may further include the step of anisotropically wet etching the trench in a batch process. The step of anisotropically wet etching preferably forms rectangular trenches. The substrate is preferably comprised of monocrystalline silicon, and the step of anisotropically wet etching may include the step of removing silicon from the trench according to crystallographic surfaces of the substrate. The anisotropic wet etching preferably forms a trench with a rectangle shape, and the step of removing may include the step of expanding surfaces of the trench to (110) surfaces. The wet etching preferably provides smoother surfaces than conventional methods of etching. For example, a surface planarity is 15 nm or less over a depth of a trench. The steps of forming a buried plate electrode prior to the anisotropic etch or after the anisotropic etch may be included. The step of wet etching preferably has a selectivity ratio of greater than 1000:1 between the substrate and the collar. The present invent on also improves surface roughness of the silicon substrate surface over the surface roughness for RIE processes.

These and other objects, features and advantages of the present invention will become apparent from the following detailed description of Illustrative embodiments thereof, which is to be read in connection wish the accompanying drawings.

BRIEF DESCRIPTION OF DRAWINGS

This disclosure will present in detail the following description of preferred embodiments with reference to the following figures wherein.

DETAILED DESCRIPTION OF PREFERRED EMBODIMENTS

The present invention relates to semiconductor fabrication and more particularly, to a method for forming bottle shaped trench capacitors for semiconductor memories by employing an anisotropic wet etch process. To increase the capacitance of a single storage cell of a deep trench memory device, the deep trench needs to be expanded to increase surface area. A reactive ion etch (RIE) process may be used to form a bottle shaped trench, but suffers from a high cost single wafer process, polymer residuals left as a result of this type of etching, surface roughness and poor selectivity to a LOCOS collar oxide.

To overcome these disadvantages, the present invention includes a basic (pH greater than 7) chemistry wet etch, which may be performed in a batch tank process. The method of the present invention is advantageously selective to oxide and nitride, and smooths surfaces where etching occurs. The present invention also preferably creates a rectangular shaped deep trench which provides increased surface area as compared to the RIE process which forms round trenches.

Figure 1:
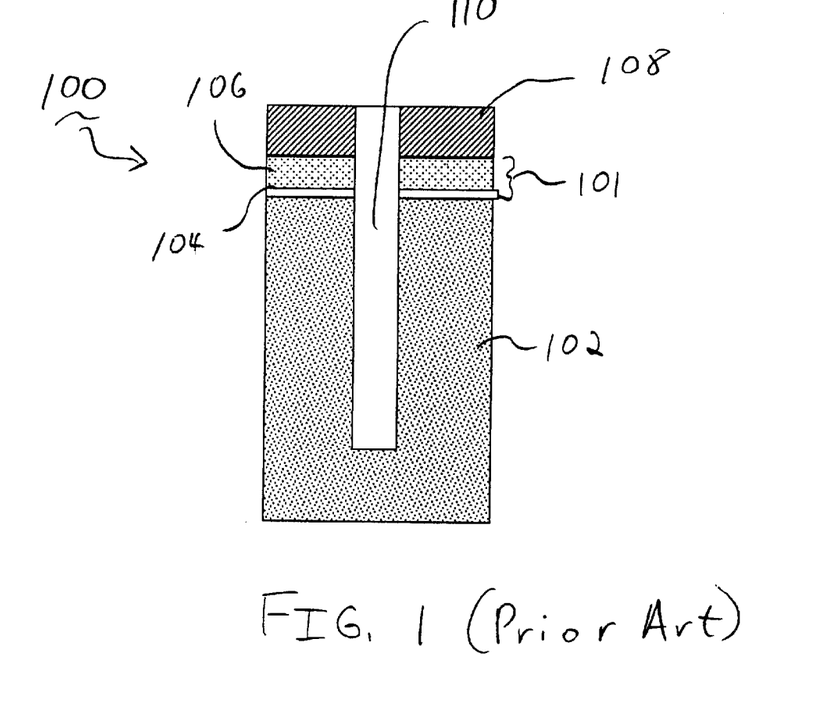
FIG. 1 is a cross-sectional view of a conventional semiconductor device having a trench formed therein for processing in accordance the present invention.

Referring now in specific detail to the drawings in which like reference numerals identify similar or identical elements throughout the several views, and initially to FIG. 1, a memory device 100 includes a substrate 102 having a pad stack 101 formed thereon. Memory device 100 may include a dynamic random access memory (DRAM), synchronous DRAM, static RAMs, and read only memories or other memory integrated circuits. Substrate 102 is preferably a monocrystalline silicon substrate, however other substrates may be employed, for example a silicon on insulator substrate. Pad stack 101 may include various layers of materials used to further process memory device 100. In a preferred embodiment, pad stack 101 includes an oxide layer 104 and a nitride layer 106. A hard mask layer 108 is deposited on pad stack 101. Hard mask 108 is patterned using lithographic techniques known to those skilled in the art. For example, a resist layer may be deposited on hardmask layer 108, exposed and developed to open up holes at locations where trenches 110 will be formed. Formation of trench 110 is preferably formed by employing an anisotropic etch, such as a reactive on etch (RIE). Trench 110 is etched into substrate 102.

In an alternate embodiment, trench 110 is widened using a wet anisotropic etch process as described herein below in accordance with the present invention. In this alternate approach, hardmask 108 or an equivalent is employed to locate trenches 110 and after trench 110 Is formed the entire trench is widened by the wet etch process. (See FIG. 17).

Figure 2:
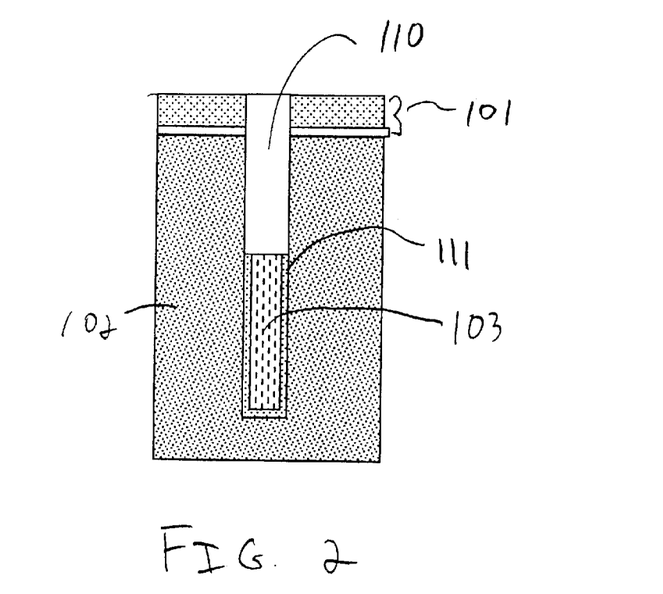
FIG. 2 is a cross-sectional view of the semiconductor device of FIG. 1 having a buried plate being formed therein by employing a dopant source layer for processing in accordance the present invention.

It is to be understood that a buried plate may be formed prior to or after the expansion of the trenches in accordance with the present invention. Referring to FIG. 2, a method for forming buried plate 112 (FIG. 3) before expansion of the trench may be employed. After removing hardmask 108, trench 110 may preferably be lined with arsenic silicate glass (ASG) layer 111 (other dopant sources may be employed as well), serving as a dopant source for forming buried plate 112. A resist layer 103 (or equivalent) may be formed over ASG layer 111 to fill trench 110. Resist layer 103 is etched back and ASG layer 111 is etched such that ASG layer 111 lines trench 110 at a lower portion only. Resist layer 103 is then removed.

Figure 3:
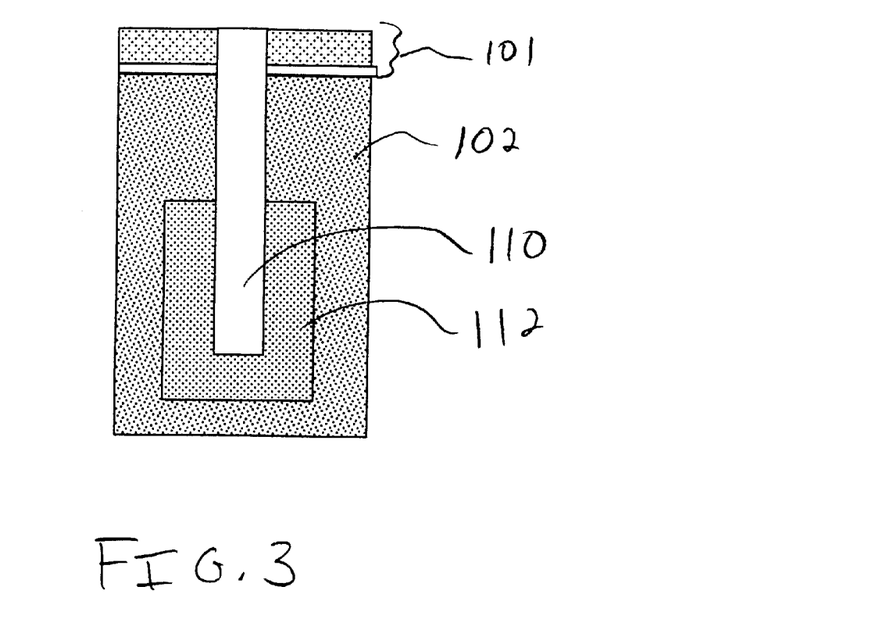
FIG. 3 is a cross-sectional view of the semiconductor device of FIG. 2 having a burled plate formed therein for processing in accordance the present invention.

Referring to FIG. 3, a buried plate 112 is formed by annealing device 100 to drive dopants into substrate 102 from ASG layer 112. Buried plate 112 functions as one of the two. capacitor electrodes employed in a trench capacitor. ASG layer 111 is removed.

Figure 4:
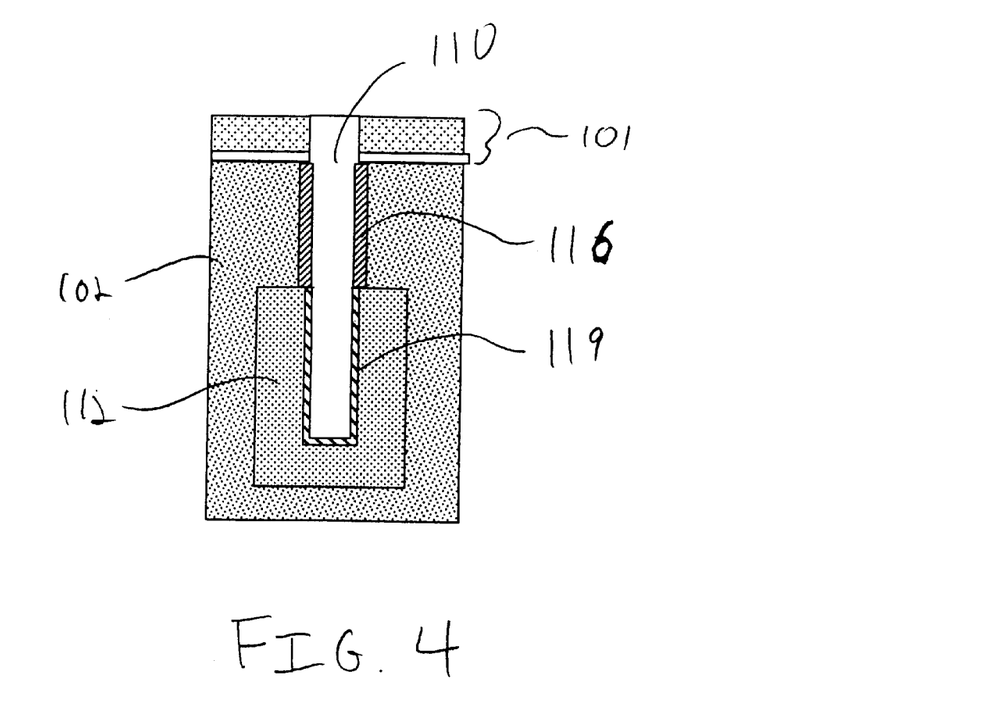
FIG. 4 is a cross-sectional view of the semiconductor device of FIG. 3 having a dielectric layer formed therein for preparing the trench for collar formation for processing in accordance the present invention.

Referring to FIG. 4, a nitride layer 119 is deposited to preferably about 50 angstroms in thickness. A resist material (not shown) is deposited within trench 110 and recessed to mark a location where a collar is to be formed in later steps. Exposed portions of layer 119 are removed, and then the remaining resist material is removed from trench 110. A collar 116 is formed in an upper portion of trench 110. Collar 116 is formed on substrate 102 preferably by performing an oxidation process(for example a local oxidation of silicon (LOCOS)) of the silicon in substrate 102. Layer 119, preferably a nitride, protects lower portions of trench 110 from this oxidation (since nitride acts as a barrier). Other processes may be employed to form collar 116 as well. For example, a TEOS deposition process may be employed. Collar 116 is formed to prevent parasitic leakage currents from discharging the trench capacitor in operation. Remaining portions of layer 119 are removed selective to collar 116. Collar 116 may be annealed to densify the oxide material.

Figure 5:
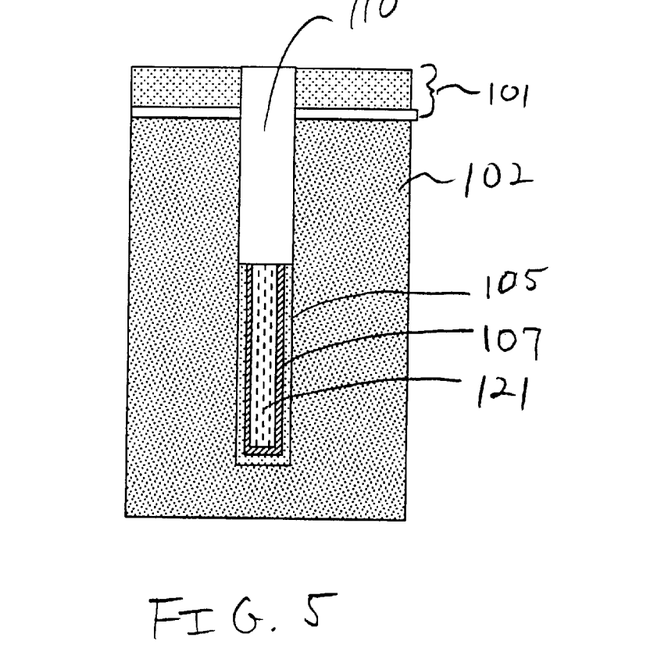
FIG. 5 is a cross-sectional view of a semiconductor device showing a dopant source stack in an alternate method for forming a buried strap for processing in accordance the present invention.
Figure 6:
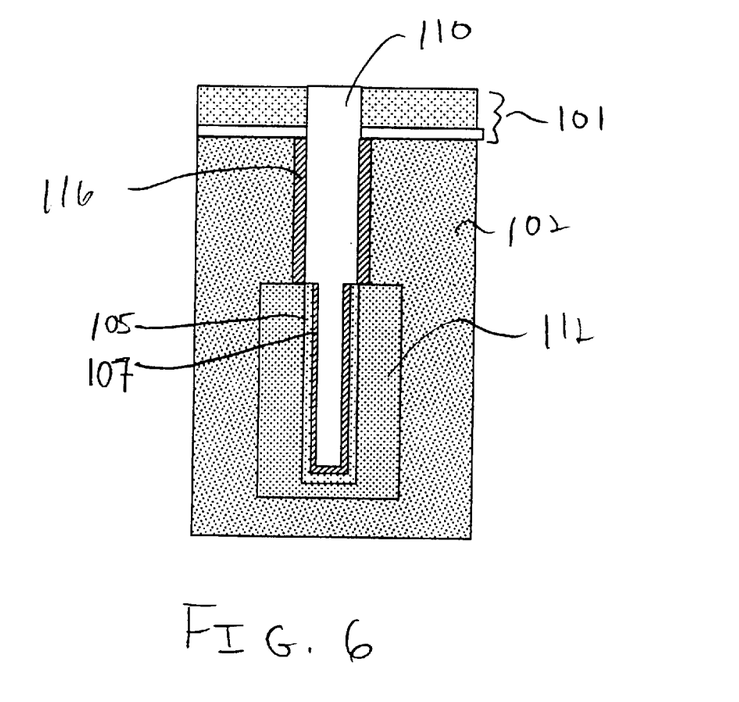
FIG. 6 is a cross-sectional view of the semiconductor device of FIG. 5 showing the buried strap and a collar formed for processing in accordance the present invention.

Referring to FIG. 5, a self-aligned method for forming buried plate 112 (FIG. 6) prior to expanding the trench may be employed. After removing hardmask 108 (FIG. 1), trench 110 may be lined with arsenic silicate glass (ASG)/TEOS stack 105, serving as a dopant source for forming buried plate 112 (FIG. 6). The thin TEOS layer(or equivalent) may be formed over the ASG layer (or other dopant source material) to form stack 105. A nitride liner 107 is then deposited, and trench 110 is filled with a resist 121. Resist 121 is etched back to define a lower portion of a collar to be formed in a later step. Stack 105 and layer 107 are removed to the defined lower position where the collar will be formed. Resist 121 is then removed.

Referring to 6, a buried plate 112 and collar 116 are formed by oxidizing device 100 to drive dopants into substrate 102 from ASG of stack 105 to form buried plate 112. Buried plate 112 functions as one of the two capacitor electrodes employed in a trench capacitor. The ASG/TEOS/ nitride layer as described in FIG. 5 is formed to line trench 110. The nitride material of layer 107 is formed to protect surfaces of substrate 102 in trench 110 from oxidation during collar formation. A collar 116 is formed in an upper portion of trench 110. Collar 116 is formed on substrate 102 preferably by performing an oxidation (LOCOS) of the silicon in substrate 102. Layer 107 protects lower portions of trench 110 from this oxidation since nitride acts as a barrier. Other processes may be employed to form collar 116 as well. For example, a TEOS deposition process may be employed. Collar 116 is formed to prevent parasitic leakage currents from discharging the trench capacitor in operation. Remaining portions of stack 105 and layer 107 are removed selective to collar 116. Collar 116 may be annealed to densify the oxide material.

Figure 7:
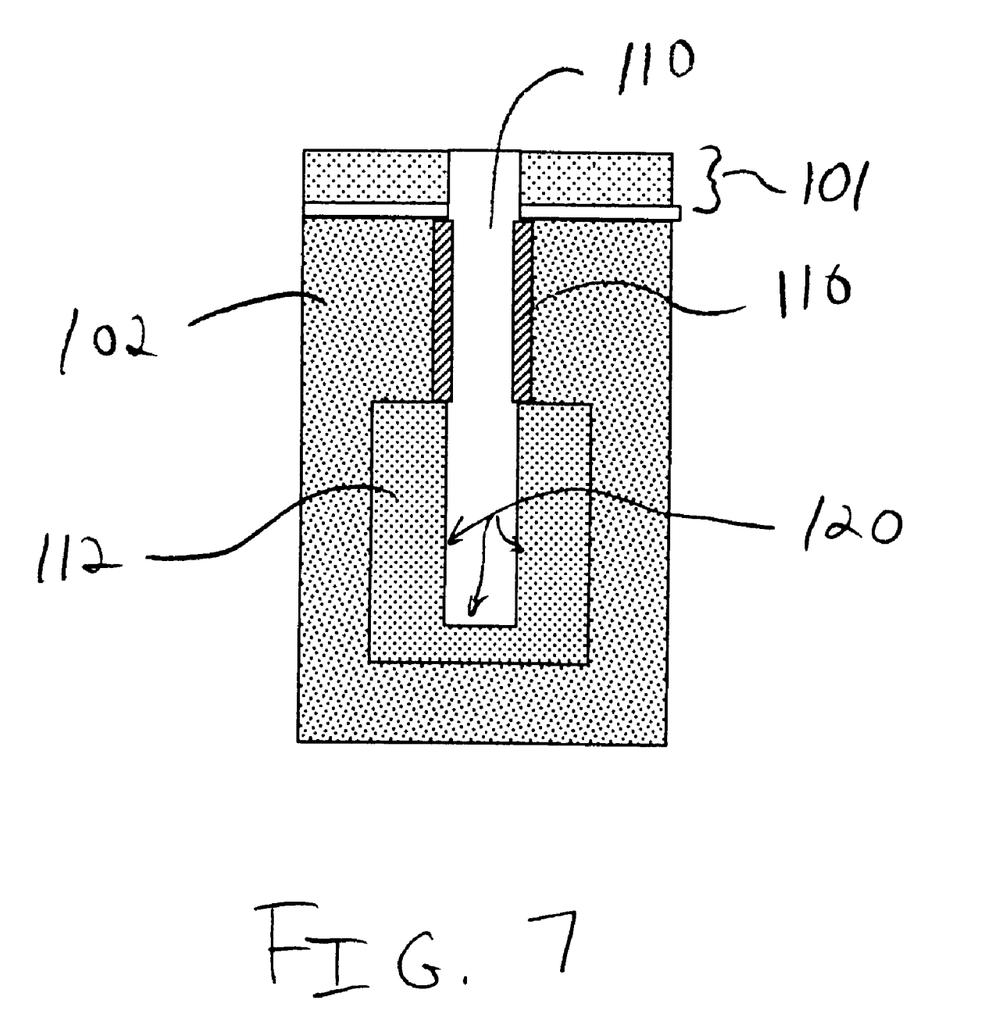
FIG. 7 is a cross-sectional view of the semiconductor device of FIGS. 4 or 6 showing the lower portion of the trench prepared in accordance with the present invention.

Referring to FIG. 7, the two alternative paths (FIG. 4 and FIG. 6) for forming a buried plate 112 prior to expanding the trench provide the structure of FIG. 7. Collar 116 protects an upper portion of trench 110. The lower portion of trench 110 is now processed in accordance with the invention. An anisotropic wet etch process in accordance with the present invention is preferably preceded by a preparation step. The preparation step may employ a wet etch, a dry etch or other process steps capable of removing native oxygen from a surface 120. In a preferred embodiment, the preparation step employs a diluted hydrofluoric (200 to 1) wet etch of surface 120 to prepare surface for further processing. The preparation step may include other processes, such as an HF vapor etch or an $H_2$ bake, for example. The preparation step creates a hydrogen terminated surface. By reacting HF with Si, hydrogen atoms remain at surface 120. The HF preparation process is preferably performed for between about 60 seconds to about 180 seconds (for 200:1, parts water to parts HF), however other times and concentrations may be used depending on the design and circumstances. Other preparation processes are contemplated provided a hydrogen terminated silicon surface is provided. The preparation step may be omitted in some embodiments if native oxide is removed in conjunction with other process steps.

Figure 8:
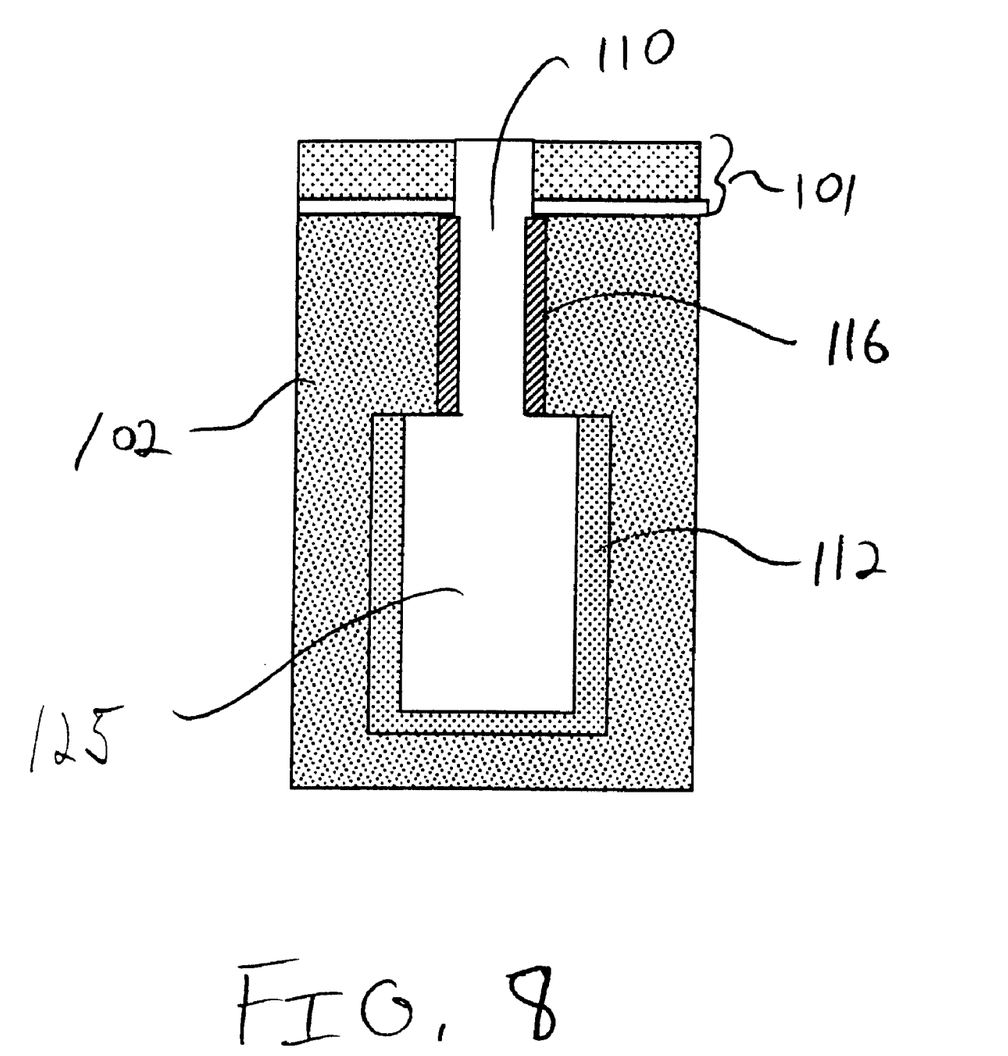
FIG. 8 is a cross-sectional view of the semiconductor device of FIG. 7 showing the lower portion of the trench anisotropically wet etched in accordance with the present invention.

Referring to FIG. 8, the preparation step is followed by an anisotropic etch process. A wet etchant is employed to anisotropically etch away silicon of substrate 102. The wet etchant preferably includes a basic solution. In a preferred embodiment, ammonium hydroxide ($NH_4OH$) is employed as an etchant ($NH_4OH$ may be diluted in water, or example 180 parts water to 1 part $NH_4H$), although other preferred solutions may include potassium hydroxide or other bases, i.e., solutions with a pH greater than 7). The etching process is more uniform due to the hydrogen terminated surface created by the preparation step. The etching is preferably performed at a temperature of between about 10° C. to about 80° C., although other temperature conditions may be used depending. on the circumstances. The wet etching process may be performed for between about 60 seconds to about 300 seconds depending on the amount of etching desired, the temperature conditions and the concentration of the etchant. If ammonium hydroxide is employed a selectivity of greater than 1000:1 is achieved relative to collar 116.

Crystallographic directions of substrate 102 advantageously affect the etching process. In one embodiment, a (100) silicon surface gets etched faster than a (110) silicon surface. This is advantageous since the (110) surfaces may be oriented in a direction where expansion of trenches 110 is less desirable, for example, expansion in a direction toward another trench. In addition, lower surface roughness and higher surface planarity are achieved due to the wet etching process. For example, by employing the wet etch process surface planarity is reduced to below 15 nm, and preferably below 4 nm over the depth of a trench (e.g., 6 microns or deeper). Other surface features may benefit from the present invention as well. This dramatically is improved over the surface planarity of about 20 nm achieved by conventional RIE processes.

Trenches 110 are positioned to orient the direction of the silicon crystal in accordance with the expansion etch rates most advantageous to the design. The dopant density may also be adjusted in buried plate 112 to affect etch rates for the etch process in accordance with the invention. In addition, since crystal directions affect the etch rates, rectangular lower portions 125 of trenches 110 are achieved. This results in an area increase for trench 110 of up to about 80° or higher. Also, the etch process of the present invention leaves collar 116 substantially untouched by the etching process. Further, the wet etch process lends itself to inexpensive batch processing with high throughput and employs inexpensive chemistry.

After expansion of trench 110, a nitride dielectric is deposited to line trench 110, a storage node (not shown) is formed within trench 110 using methods known to those skilled in the art. Storage node is preferably formed by depositing polysilicon in trench 110. This may be performed in steps or all in a single process.

Figure 9:
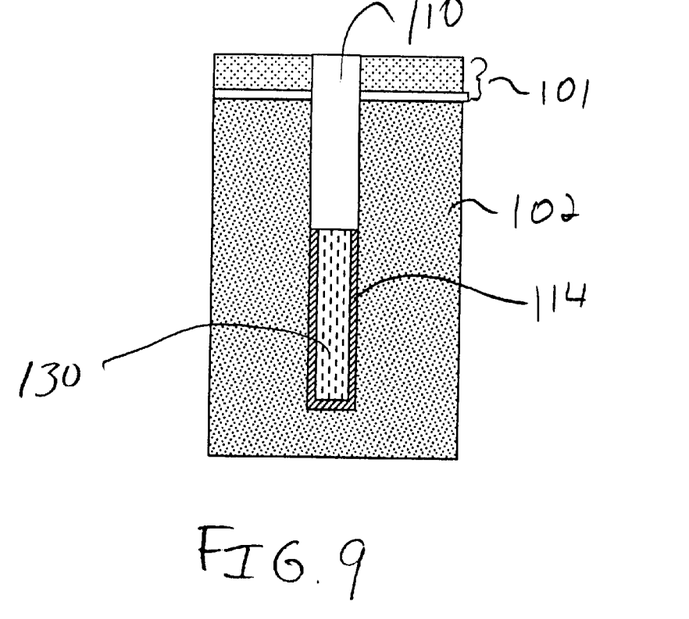
FIG. 9 is a cross-sectional view of a semiconductor device showing a lower portion of the trench lined with a barrier layer and filled with a resist for processing in accordance with the present invention.

Referring to FIG. 9, an alternate method of the present invention forms a buried plate after the anisotropic wet etch process to expand the trench. After the structure in FIG. 1 is provided, a nitride liner 114 is deposited in trench 110. A resist 130 is formed in trench 110 and recessed to a location where an insulating collar will be formed in later steps. Recessing resist 130 exposes a portion of nitride liner 114. The exposed portions of nitride liner 114 are removed preferably by a wet etch process.

Figure 10:
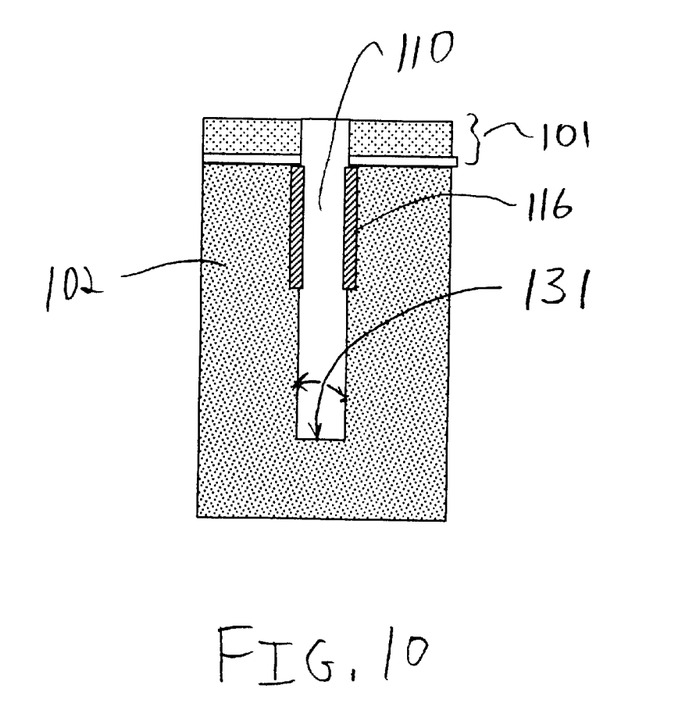
FIG. 10 is a cross-sectional view of the semiconductor device of FIG. 9 showing the lower portion of the trench prepared in accordance with the present invention.

Referring to RIG. 10, a collar 116 is formed in an upper portion of trench 110. Collar 116 is formed on substrate 102 preferably by performing an oxidation (LOCOS) of the silicon in substrate 102. Liner 114 (FIG. 9) protects lower portions of trench 110 from this oxidation since nitride acts as a barrier. Remaining portions of liner 114 are removed selective to collar 116. Collar 116 may be annealed to densify the oxide material. A surface 131 may be prepared using the preparation step as described above with reference to FIG. 7.

Figure 11:
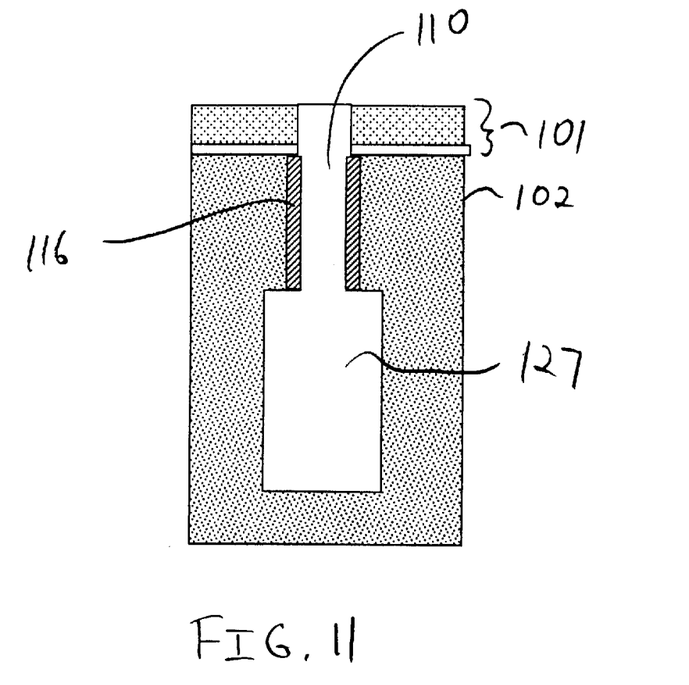
FIG. 11 is a cross-sectional view of the semiconductor device of FIG. 10 showing the lower portion of the trench anisotropically wet etched in accordance with the present invention.

Referring to FIG. 11, the anisotropic wet etch process which may include the preparation step and an etch as described above with reference to FIGS. 7 and 8 is performed to expand a lower portion 127 of trench 110 below collar 116.

Figure 12:
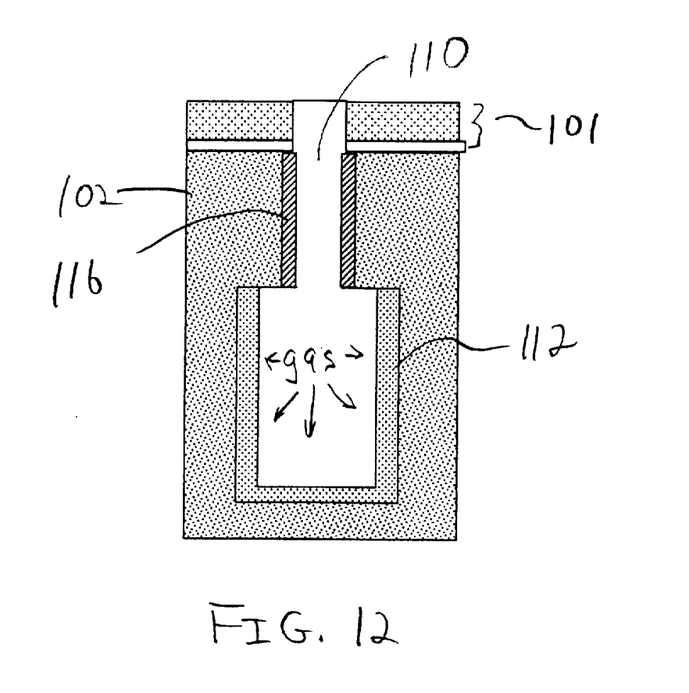
FIG. 12 is a cross-sectional view of the semiconductor device of FIG. 11 showing the lower portion of the trench gas doped to form a burled strap in accordance with the present invention.

Referring to FIG. 12, since a buried plate was not formed prior to the wet etch, buried plate 112 is formed by a gas doping process. Gas doping provides dopants in a gaseous form which adsorb onto an exposed surface substrate 102 and diffuse into substrate to form buried plate 112. Gas doping may include arsenic or other dopants included In a hot gas introduced into trench 110.

After formation of buried plate 112, a nitride dielectric is deposited to line trench 110, a storage node (not shown) is formed within trench 110 using methods known to those skilled in the art. Storage node is preferably formed by depositing polysilicon in trench 110. This may be performed in steps or all in a single process.

Figure 13:
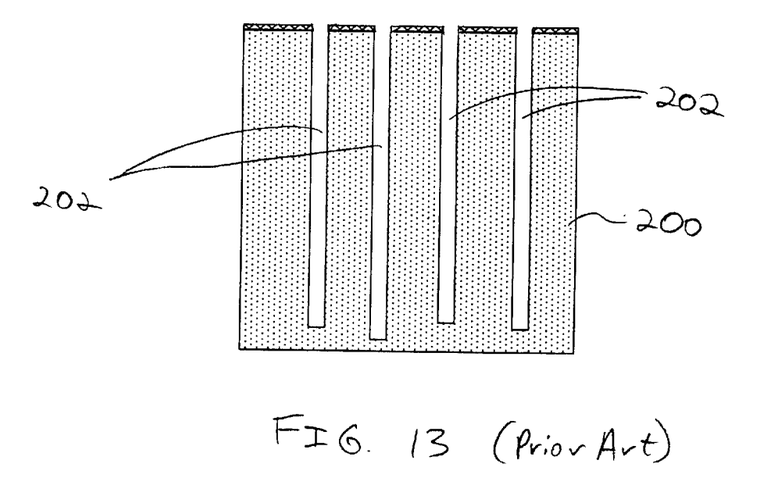
FIG. 13 Is a cross-sectional view of a semiconductor substrate showing trenches formed in accordance with the prior art.
Figure 14:
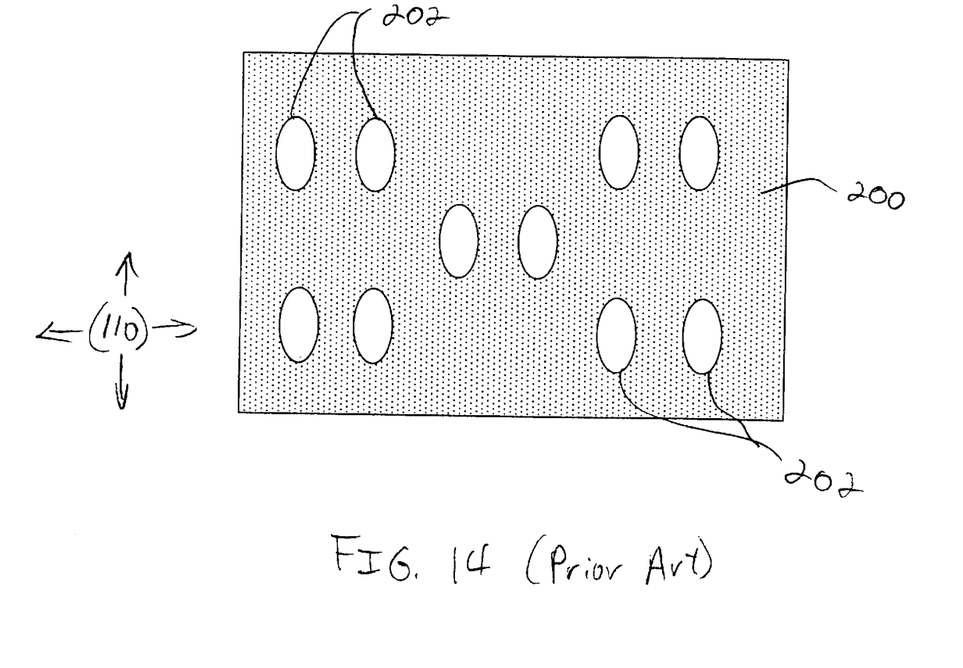
FIG. 14 is a top view of the semiconductor substrate of FIG. 13 showing trenches formed in accordance with the prior art.

Referring to FIGS. 13 and 14, a cross-sectional view of a silicon semiconductor substrate 200 is shown. Substrate 200 includes trenches 202 formed in accordance with the prior art. Trenches 202 represent trenches which have been formed by conventional methods and are to be expanded in accordance with the present invention. As shown in FIG. 14, deep trenches have a generally circular shape. (110) crystallographic surfaces extend vertically and horizontally as indicated in FIG. 14.

Figure 15:
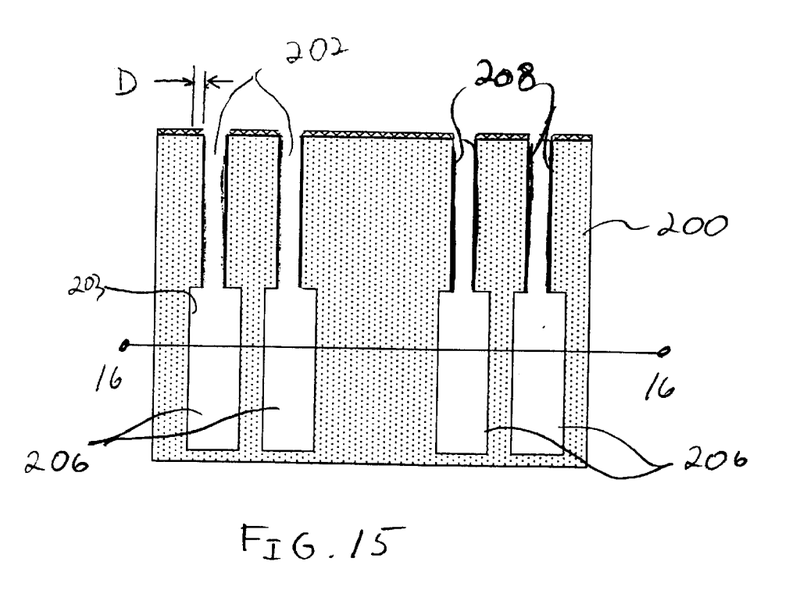
FIG. 15 is a cross-sectional view of the semiconductor substrate of FIGS. 13 and 14 showing trenches anisotropically wet etched to expand the trenches below a collar formed in the trenches in accordance with the present invention.

Referring to FIG. 15, trenches 202 (FIGS. 13 and 14) include a portion which is to be widened or expanded below a collar 208. In one illustrative embodiment, lower portions 206 of trenches 202 may be laterally recessed beyond collar 208 by more than about 50 nm as indicated by "D". Other dimensions are contemplated as well.

Figure 16:
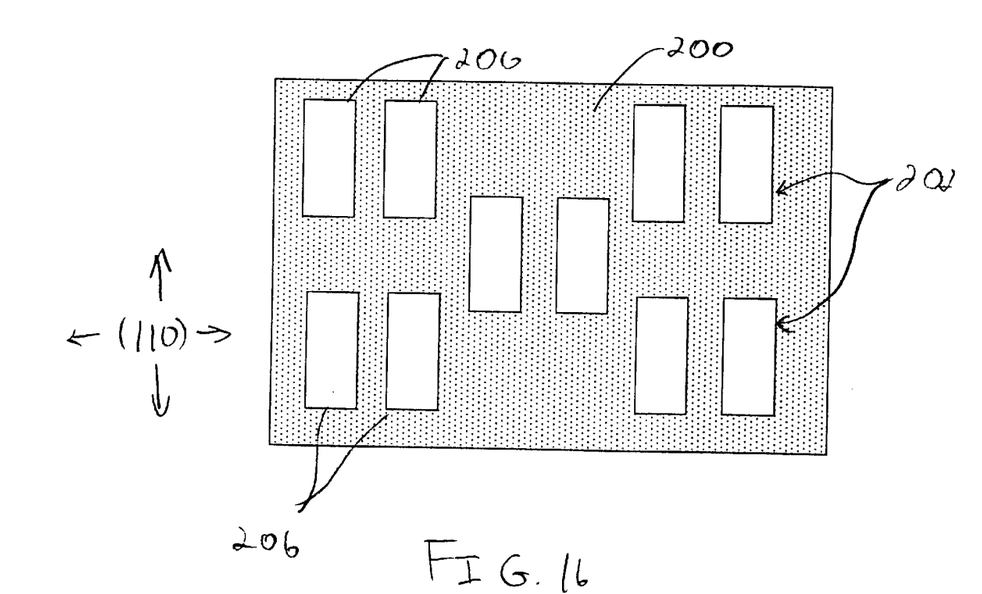
FIG. 16 is a cross-sectional view taken along section line 16—16 of FIG. 15 showing rectangular shaped trench cross-sections and miller indices for (110) crystal surfaces of the substrate in accordance with the present invention.

Referring to FIG. 16, a cross-sectional view of substrate 200 taken along section line 16—16 of FIG. 15 is shown. Rectangular shapes are shown for expanded portions 206 of trenches 202. (110) crystal surfaces are indicated. Due to the anisotropic nature of he wet etch process in accordance with the present invention, all crystallographic surfaces are expanded outward at a faster rate than the expansion of (110) crystal surfaces. For example, the wet etching process in accordance with the present invention etches (100) surfaces faster than (110) surfaces to provide the rectangular shapes shown. Once the rectangular shape is achieved corresponding to (110) surfaces, etching may be continued at a slower rate for (110) surfaces while maintaining the rectangular shape. The length and width of the trenches are advantageously aligned to the (110) surfaces and circular trenches are advantageously expanded to (110) surfaces.

Figure 17:
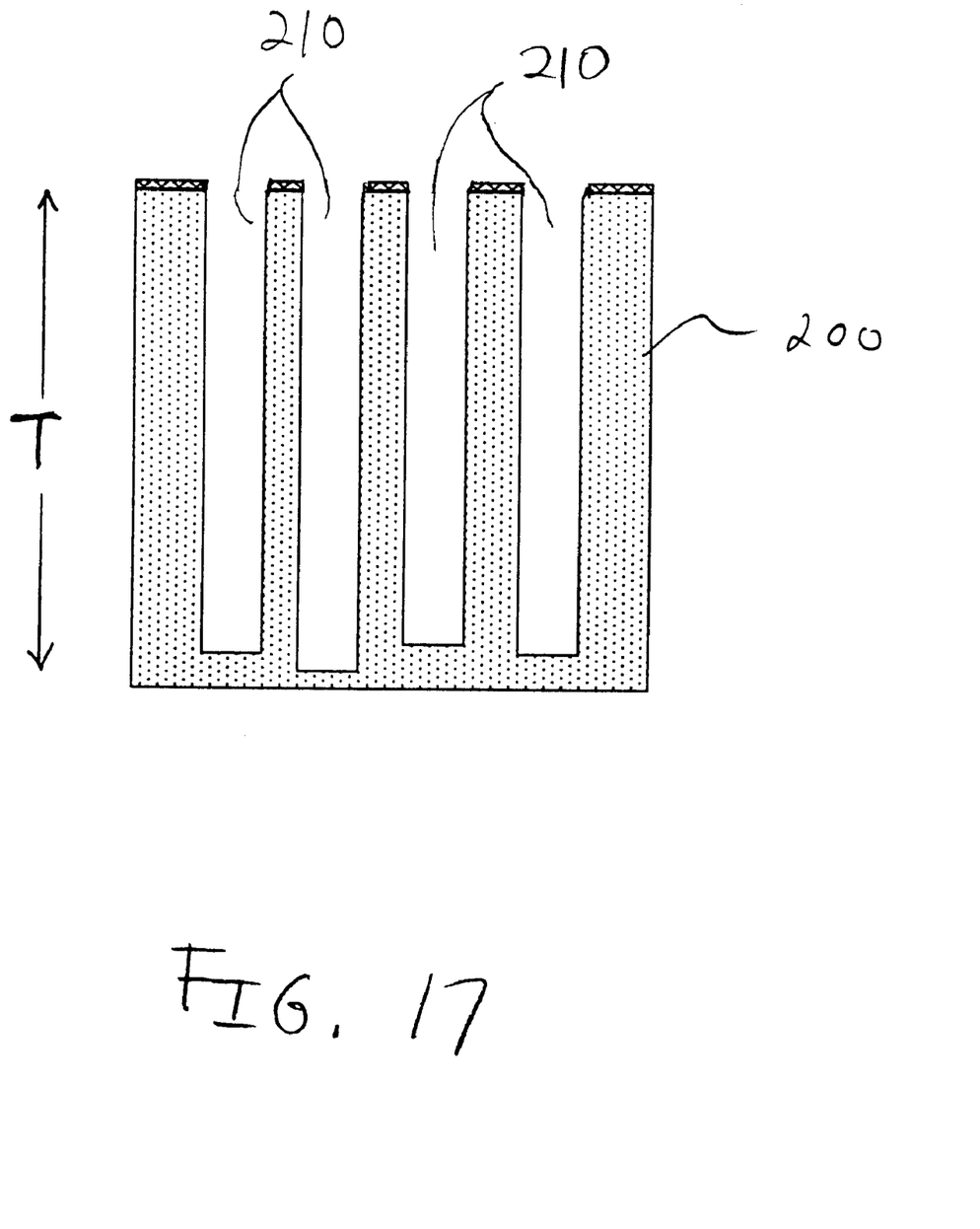
FIG. 17 is a cross-sectional view of a semiconductor substrate showing trenches anisotropically wet etched to expand the trenches along the entire depth of the trenches in accordance with the present invention.

Referring to FIG. 17, trenches 202 (FIGS. 13 and 14) may alternately by expanded along the entire depth "T" of the trench by employing the wet anisotropic etch process of the present invention. Expanded trenches 210 are thereby formed in substrate 200.

Although described in several illustrative embodiments, the present invention is not limited by these examples. Other processes and materials may be used. For example, the insulating collar may be formed using different processes or made from different compounds, e.g., TEOS. Further, the invention is not limited to deep trenches and may be applicable to widening any trenches formed in substrates. Also, HF and NH$_4$OH may be employed as etchants in different combinations, substituted by other materials or used in combination with other etchants or compounds. The invention provides an anisotropic wet etch to form bottle shaped trenches or widen trenches, with at least the following advantages.

1. High selectivity towards oxide and nitride: no collar thinning.

2. Inexpensive process: wet batch process with high throughput and inexpensive chemistry employed.

3. Higher storage capacitance: a rectangular shaped trench is formed, that has higher capacitance than a round shaped trench of the same depth.

4. Lower surface roughness: due to the anisotropic nature of the etching, only one crystallographic orientation is prepared, which gives a very smooth surface and better than 15 nm surface planarity.

Having described preferred embodiments for a method for expanding trenches by an anisotropic wet etch (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by Letters Patent is set forth in the appended claims.

What is claimed is:

1. A method for expanding vertical trenches comprising the steps of:

selecting a crystallographic orientation for a silicon substrate for forming pairs of adjacent trenches such that a longest axis of each of the trenches is parallel to (110) surfaces of the substrate;

forming a first trench and a second trench adjacent to each other in the substrate having the longest axes of the first and second trenches parallel;

preparing surfaces within the trench by etching the surfaces with a wet etchant to provide a hydrogen terminated silicon surface; and anisotropically wet etching the hydrogen terminated silicon surface of the trenches to expand the trenches to (110) surfaces by etching (100) surfaces such that expansion of the first and second trenches toward each other is reduced to maintain spacing between the first and second trenches; and wherein a buried electrode is formed prior to said anisotropic etch.

2. The method as recited in claim 1, wherein the step of preparing surfaces within the trenches includes the step of preparing the surfaces by wet etching the surfaces with hydrogen fluoride.

3. The method as recited in claim 1, wherein the step of anisotropically wet etching the trenches to expand the trench includes the step of anisotropically wet etching the trenches by employing ammonium hydroxide.

4. The method as recited in claim 1, wherein the step of anisotropically wet etching the trenches to expand the trenches includes the step of anisotropically wet etching the trenches at temperatures of between about 10 EC to about 80 EC.

5. The method as recited in claim 1, wherein the step of anisotropically wet etching the trenches to expand the trenches includes the step of anisotropically wet etching the trenches in a batch process.

6. The method as recited in claim 1, wherein the step of anisotropically wet etching forms rectangular trenches.

7. The method as recited in claim 1, wherein anisotropically wet etching includes providing a surface planarity of less than 15 nm for sidewalls along a depth of the trenches.

8. A method for forming expanded vertical deep trenches for semiconductor devices comprising the steps of:

selecting a crystallographic orientation for a silicon substrate for forming pairs of adjacent trenches such that a longest axis of each of the trenches is parallel to (110) surfaces of the substrate;

forming a first trench and a second trench adjacent to each other in the substrate having the longest axes of the first and second trenches parallel;

forming a collar in an upper portion of the trenches;

anisotropically etching a lower portion of the trenches selective to the collar by:
  preparing a surface of the lower portion of the trenches by providing a hydrogen terminated surface on the lower portion of the trenches; and
  anisotropically wet etching the hydrogen terminated surface of the lower portion of the trenches to expand the trenches to (110) surfaces by etching (100) surfaces such that expansion of the first and second trenches toward each other is reduced to maintain spacing between the first and second trenches; and wherein a buried plate electrode is formed prior to said anisotropic etch.

9. The method as recited in claim 8, wherein the step of preparing a surface of the lower portion includes the step of preparing the surface by wet etching the surfaces with hydrogen fluoride.

10. The method as recited in claim 8, wherein the step of anisotropically etching includes the step of anisotropically etching by employing ammonium hydroxide.

11. The method as recited in claim 8, wherein the step of wet etching includes the step of wet etching the lower portion of the trenches at temperatures of between about 10 EC to about 80 EC.

12. The method as recited in claim 8, wherein the step of anisotropically wet etching includes the step of wet etching the trenches in a batch process.

13. The method as recited in claim 8, wherein the step of anisotropically wet etching forms rectangular trenches.

14. The method as recited in claim 8, wherein the wet etching has a selectivity ratio of greater than 1000:1 between the substrate and the collar.

15. The method as recited in claim 8, wherein the step of anisotropically wet etching includes providing a surface planarity of less than 15 nm for sidewalls along a depth of the trenches.

16. The method of claim 1 wherein the buried plate is formed simultaneously with the formation of a collar in an upper portion of the trenches.

17. The method of claim 8 wherein the collar and buried plate are formed simultaneously.

* * * * *